(12) United States Patent
Alqahtani et al.

(10) Patent No.: US 11,961,702 B2
(45) Date of Patent: Apr. 16, 2024

(54) FABRICATION OF IN SITU HR-LCTEM NANOFLUIDIC CELL FOR NANOBUBBLE INTERACTIONS DURING EOR PROCESSES IN CARBONATE ROCKS

(71) Applicant: Saudi Arabian Oil Company, Dhahran (SA)

(72) Inventors: Hassan Alqahtani, Dhahran (SA); Dong Kyu Cha, Dhahran (SA); Mohammed Al Otaibi, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 200 days.

(21) Appl. No.: 17/546,604

(22) Filed: Dec. 9, 2021

(65) Prior Publication Data
US 2023/0187170 A1 Jun. 15, 2023

(51) Int. Cl.
*H01J 37/26* (2006.01)

(52) U.S. Cl.
CPC ..... *H01J 37/261* (2013.01); *H01J 2237/2003* (2013.01); *H01J 2237/2802* (2013.01)

(58) Field of Classification Search
CPC ............. H01J 37/261; H01J 2237/2003; H01J 2237/2802; H01J 37/20; H01J 2237/204; B01L 3/502707; B01L 2300/0896; B01L 2400/0439
See application file for complete search history.

(56) References Cited

U.S. PATENT DOCUMENTS

| | | | |
|---|---|---|---|
| 4,003,818 A | 1/1977 | Juillard et al. | |
| 4,564,997 A | 1/1986 | Matsuo | |
| 4,846,277 A | 7/1989 | Khalil | |
| 5,495,891 A | 3/1996 | Sydansk | |
| 5,513,712 A | 5/1996 | Sydansk | |
| 5,706,895 A | 1/1998 | Sydansk | |
| 6,680,206 B1 | 1/2004 | McDevitt et al. | |
| 7,199,083 B2 | 4/2007 | Zevallos | |

(Continued)

FOREIGN PATENT DOCUMENTS

| CN | 1556771 | 12/2004 |
|---|---|---|
| CN | 1681596 | 10/2005 |

(Continued)

OTHER PUBLICATIONS

Fernandez Rivas D, Kuhn S. Synergy of Microfluidics and Ultrasound : Process Intensification Challenges and Opportunities. Top Curr Chem (Cham). Oct. 2016;374(5):70. doi: 10.1007/s41061-016-0070-y. Epub Sep. 21, 2016. PMID: 27654863; PMCID: PMC5480412. (Year: 2016).*

(Continued)

*Primary Examiner* — Michael J Logie
*Assistant Examiner* — Christopher J Gassen
(74) *Attorney, Agent, or Firm* — Fish & Richardson P.C.

(57) ABSTRACT

Systems and methods for preparing a nanofluidic LCTEM cell are provided. An exemplary method includes coating a photoresist layer onto a top surface of a silicon nitride substrate; etching channels into the photoresist layer; depositing calcite into the etched channels; removing the photoresist; placing the cell on a holder; connecting a first end of an inlet line to the cell; connecting a second end of the inlet line to an ultrasound transducer configured to generate nanobubbles; and connecting an outlet line to the cell.

23 Claims, 5 Drawing Sheets

(56) References Cited

U.S. PATENT DOCUMENTS

| | | |
|---|---|---|
| 7,642,223 B2 | 1/2010 | Santra et al. |
| 9,293,750 B2 | 3/2016 | Yang et al. |
| 10,365,564 B2 | 7/2019 | Cha et al. |
| 10,761,428 B2 | 9/2020 | Cha et al. |
| 10,926,227 B2 | 2/2021 | Cha et al. |
| 10,983,439 B2 | 4/2021 | Cha et al. |
| 11,111,753 B2 | 9/2021 | Almohsin et al. |
| 2004/0146803 A1 | 7/2004 | Kohl et al. |
| 2008/0246052 A1 | 10/2008 | Hsu |
| 2009/0104564 A1 | 4/2009 | Yang |
| 2010/0330721 A1 | 12/2010 | Barlocchi et al. |
| 2011/0114318 A1 | 5/2011 | Ezell et al. |
| 2011/0123771 A1 | 5/2011 | Stavis et al. |
| 2011/0296903 A1 | 12/2011 | Han et al. |
| 2012/0120226 A1 | 5/2012 | De Jonge |
| 2012/0267603 A1 | 10/2012 | Lee et al. |
| 2013/0125630 A1 | 5/2013 | Collins et al. |
| 2013/0236698 A1 | 9/2013 | Stavis et al. |
| 2013/0316329 A1 | 11/2013 | Yu |
| 2014/0363623 A1 | 12/2014 | Sun et al. |
| 2016/0363600 A1 | 12/2016 | Sniadecki et al. |
| 2017/0067836 A1 | 3/2017 | Hull |
| 2017/0114242 A1 | 4/2017 | Lloyd et al. |
| 2019/0070566 A1 | 3/2019 | Kidambi et al. |
| 2019/0225861 A1 | 7/2019 | Reddy |
| 2020/0301282 A1 | 9/2020 | Cha et al. |
| 2021/0024813 A1 | 1/2021 | Al-Taq et al. |
| 2021/0162352 A1 | 6/2021 | Cha et al. |
| 2023/0303907 A1 | 9/2023 | Al-Nakhli et al. |

FOREIGN PATENT DOCUMENTS

| | | |
|---|---|---|
| CN | 101084469 | 12/2007 |
| CN | 101323780 | 12/2008 |
| CN | 101493006 | 7/2009 |
| CN | 101831163 | 9/2010 |
| CN | 108025909 | 5/2018 |
| CN | 111108440 | 5/2020 |
| JP | 2004193525 | 7/2004 |
| JP | 2006514413 | 4/2006 |
| JP | 2006520697 | 9/2006 |
| JP | 2009134255 | 6/2009 |
| JP | 2009539261 | 11/2009 |
| JP | 2010518615 | 5/2010 |
| JP | 2013527103 | 6/2013 |
| JP | 2015128818 | 7/2015 |
| JP | 6947482 | 10/2021 |
| KR | 20160014504 | 2/2016 |
| WO | WO 2009149362 | 12/2009 |
| WO | WO 2013078306 | 5/2013 |
| WO | WO 2015161205 | 10/2015 |
| WO | WO 2017009710 | 1/2017 |
| WO | WO 2019032903 | 2/2019 |

OTHER PUBLICATIONS

Becker et al., "Polymer microfluidic devices," Talanta, Feb. 11, 2002, 56(2), 21 pages.

Kim et al., "Liquid-cell Transmission Electron Microscopy for Tracking Self-assembly of Nanoparticles," Journal of Visualized Experiments, 2017, 128, 10 pages.

Kim et al., "Potential of nanobubbles generated by ultrasonication in aqueous alkyl polyglycoside solutions," Journal of Colloid and Interface Science, 2000, 223:285-291, 7 pages.

Lee et al., "Site-Selective In Situ Grown Calcium Carbonate Micromodels with Tunable Geometry, Porosity and Wettability," Advanced Functional Materials, 26, Jul. 1, 2016, 10 pages.

Lifton, "Microfluidics: an enabling screening technology for enhanced oil recovery (EOR)," Lab on a Chip, Royal Society of Chemistry, May 21, 2016, 16(10), 20 pages.

Lu et al., "Fabrication of Nanostructure by Template Method in Microfluidics," Chinese Journal of Analytical Chemistry, 37(6), Jun. 1, 2009, 6 pages.

Mo et al, "Formation and stability of ultrasonic generated bulk nanobubbles," Chinese Phys. B, 2018, 27, 118104, 8 pages.

Ohgaki et al., "Physicochemical approach to nanobubble solutions," Chemical Engineering Science, 2010, 65:1296-1300, 5 pages.

Pu et al., "Liquid cell transmission electron microscopy and its applications," Royal Society Open Science, 2020, 24 pages.

Ren et al., "Materials for Microfluidic Chip Fabrication," Accounts of Chemical Research, 46(11), Jun. 11, 2013, 11 pages.

Robertson et al., "Nanoparticle Immobilization for Controllable Experiments in Liquid-Cell Transmission Electron Microscopy," ACS Applied Materials & Interfaces, 2018, 10:22801-22808, 8 pages.

Sander et al., "Template-Assisted Fabrication of Dense, Aligned Arrays of Titania Nanotubes with Well-Controlled Dimensions of Substrates," Advanced Materials, Nov. 2004, 16(22), 6 pages.

Song et al., "Chip-off-the-rock: the study of reservoir-relevant geological processes with real-rock micromodels," Royal Society of Chemistry, 2014, 14:4382-4390, 9 pages.

Spende et al., "TiO2, SiO2, and Al2O3 coated nanopores and nanotubes produced by ALD in etched ion-track membranes for transport measurements," Nanotechnology, Aug. 2015, 26, 12 pages.

Zheng et al., "Surface Effect on Oil Transporation in Nanochannel: a Molecular Dynamics Study," Nanoscale Research letters, Jun. 2017, 12(1), 9 pages.

CA Office Action in Canadian Appln. No. 3,075,166, dated Apr. 26, 2021, 5 pages.

CN Office Action in Chinese Appln. No. 201980087226, dated Dec. 30, 2021, 12 pages, with English Translation.

GCC Examination Report in GCC Appln. No. GC 2018-35814, dated Jan. 30, 2020, 3 pages.

GCC Examination Report in GCC Appln. No. GC 2019-38180, dated Aug. 18, 2020, 5 pages.

GCC Examination Report in GCC Appln. No. GC 2019-38756, dated Sep. 29, 2020, 3 pages.

GCC Examination Report in GCC Appln. No. GC 2019-38180, dated Dec. 13, 2020, 4 pages.

GCC Examination Report in GCC Appln. No. GC 2019-38180, dated Mar. 23, 2021, 4 pages.

PCT International Search Report and Written Opinion in International Application No. PCT/US2018/046118, dated Nov. 9, 2018, 15 pages.

PCT International Search Report and Written Opinion in International Application No. PCT/US2019/048322, dated Jan. 7, 2020, 13 pages.

PCT International Search Report and Written Opinion in International Application No. PCT/US2019/063996, dated Mar. 23, 2020, 14 pages.

JP Office Action in Japanese Appln. No 2020-507597, dated Apr. 20, 2021, 5 pages, with English Translation.

JP Office Action in Japanese Appln. No 2021-591756, dated Nov. 2, 2021, 7 pages, with English Translation.

CN Office Action in Chinese Appln. No. 201880060968, dated Feb. 28, 2023, 21 pages, with English Translation.

Al-Nakhli et al., "A breakthrough water shutoff system for super-K zones in carbonate Ghawwar Field: Absorption and polymer system," SPE 179790, presented at the SPE EOR Conference at Oil and Gas West, Muscat, Oman, Mar. 2016, 22 pages.

Bageri et al., "Complex barite filter cake removal using in-situ generated acids by thermochemicals," Scientific Reports, Sep. 2020, 10:15773, 8 pages.

Hutton et al., "Fusible-particle system helps to control severe lost circulation while drilling across a fractured zone in Elk Hills Field, CA," presented at the SPE Western Regional Meeting, San Jose, California, Mar. 2009, 12 pages.

Savari et al., "Managing lost circulation in highly fractured, vulgular formations: Engineered usage of high fluid loss squeeze and reticulated foam lost circulation materials," presented at the IADC/SPE International Drilling Conference and Expedition, Galveston, Texas, Mar. 2020, 11 pages.

Tariq et al., "Reduction of Breakdown Pressure by Filter Cake Removal Using Thermochemical Fluids and Solvents: Experimental and Numerical Studies," Molecules, Jul. 2021, 26(15):4407, 21 pages.

(56) References Cited

OTHER PUBLICATIONS

Zhu et al., "Applications of a novel lost circulation additive," presented at the International Petroleum Technology Conference, Mar.-Apr. 2021, 16 pages.
EPO Communication Pursuant to Article 94(3) in European Appln. No. 19824162.2, dated Jan. 26, 2023, 4 pages.

* cited by examiner

FABRICATION OF IN SITU HR-LCTEM NANOFLUIDIC CELL FOR NANOBUBBLE INTERACTIONS DURING EOR PROCESSES IN CARBONATE ROCKS

TECHNICAL FIELD

The present disclosure relates to the fabrication of nanofluidic cells for nanobubble interactions.

BACKGROUND

Enhanced oil recovery (EOR) processes are utilized to increase the amount of crude oil that can be extracted from an oil field. Nanobubble injection is a promising EOR technique that generally involves injecting nanobubbles into an oil reservoir and recovering oil that is mobilized by the nanobubbles. Nanofluidic models attempt to model EOR techniques, such as nanobubble injection, by replicating oil reservoir conditions to understand physical and chemical phenomena associated with the techniques.

Studying nanobubbles and oil interaction is important because fluids can behave differently at the nanoscale due to the increased importance of factors such as surface tension. Nanobubble EOR methods can be improved with a better understanding of fluid behavior at the nano scale.

Liquid cell transmission electron microscopy (LCTEM) is a type of nanofluid model that has the advantage of characterizing the nanomaterials in both static and dynamic conditions at the nanoscale. Ordinary techniques, such as cryo-TEM, cannot characterize the dynamic behaviors due to the vitrified nature of the specimen. LCTEM techniques may include analyzing a cell of $CaCO_3$ (calcite) with etched channels.

SUMMARY

Certain aspects of the invention are implemented as method of preparing a nanofluidic LCTEM cell. The method includes coating a photoresist layer onto a top surface of a silicon nitride substrate; etching channels into the photoresist layer; depositing calcite into the etched channels; removing the photoresist; placing the cell on a holder; connecting a first end of an inlet line to the cell; connecting a second end of the inlet line to an ultrasound transducer configured to generate nanobubbles; and connecting an outlet line to the cell.

Certain aspects of the invention are implemented as a nanofluidic LCTEM cell. The cell includes a silicon nitride substrate; calcite channels on the top of the substrate; a first end of an inlet line connected to the cell; a second end of the inlet line connected to an ultrasound transducer configured to generate nanobubbles; and an outlet line connected to the cell.

The details of one or more implementations of the subject matter of this specification are set forth in the accompanying drawings and the description. Other features, aspects, and advantages of the subject matter will become apparent from the description, the drawings, and the claims.

DETAILED DESCRIPTION

The following detailed description describes systems and methods of fabricating nanofluidic cells, and is presented to enable any person skilled in the art to make and use the disclosed subject matter in the context of one or more particular implementations. Specifically, according to some implementations, the disclosed subject matter describes techniques for fabricating a nanofluidic calcite cell for in-situ characterization in scanning electron microscopy (SEM) by using combination of atomic layer deposition (ALD), electron beam lithography (EL), and an ultrasound transducer.

Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

In some implementations, techniques can be used to prepare a nanofluidic cell with calcite channels. The prepared nanofluidic cell is used to study the physical and chemical interactions between oil, brine, nanobubbles, and calcite with high resolution.

In some implementations, the nanofluidic cell is fabricated as follows. The nanofluidic cell is fabricated using a combination of EL and ALD. A liquid sample including oil, brine, and nanobubbles, and calcite are enclosed within the cell. The sample and calcite mimic carbonate reservoir properties, as they are maintained under controlled environmental conditions. The nanobubbles are generated by a ultrasound transducer. The sample is injected into the cell through an inlet line while oil is injected through a second inlet line. In some implementations, the calcite is replaced with other rock material.

In some implementations, the sample and calcite are recorded as follows. The nanobubble EOR process in the cell is analyzed using a high-resolution scanning/transmission electron microscope (S/TEM) through an in situ liquid cell transmission electron microscope (LCTEM) holder. Additionally, liquid cell microscopy is used for energy dispersive spectroscopy (EDS) elemental analysis of liquid samples within the TEM images. The liquid layer depth is thin to minimize electron scattering and obtain high-resolution video and static images.

In some implementations, the LCTEM has the following capabilities. The heating and pressure capabilities allow for the simulation of reservoir conditions. Temperature can be changed from room temperature to 1200° C. Gasses can be delivered at pressures ranging from 1 Torr to 760 Torr.

In some implementations, applying this invention to a nanobubble EOR process will provide insight characterization and an understanding for dynamic fluid behavior at reservoir conditions and also the interaction between fluids, rock, and nanobubbles with pressure and temperature variations at a high-resolution nanoscale level.

In some implementations, ultrasonication is used to generate nanobubbles to flow to the nanofluidic cell to simulate nanobubble EOR techniques. The ultrasonication relies on the inducement of supersaturation, which nucleates nanobubbles.

Figure 1:
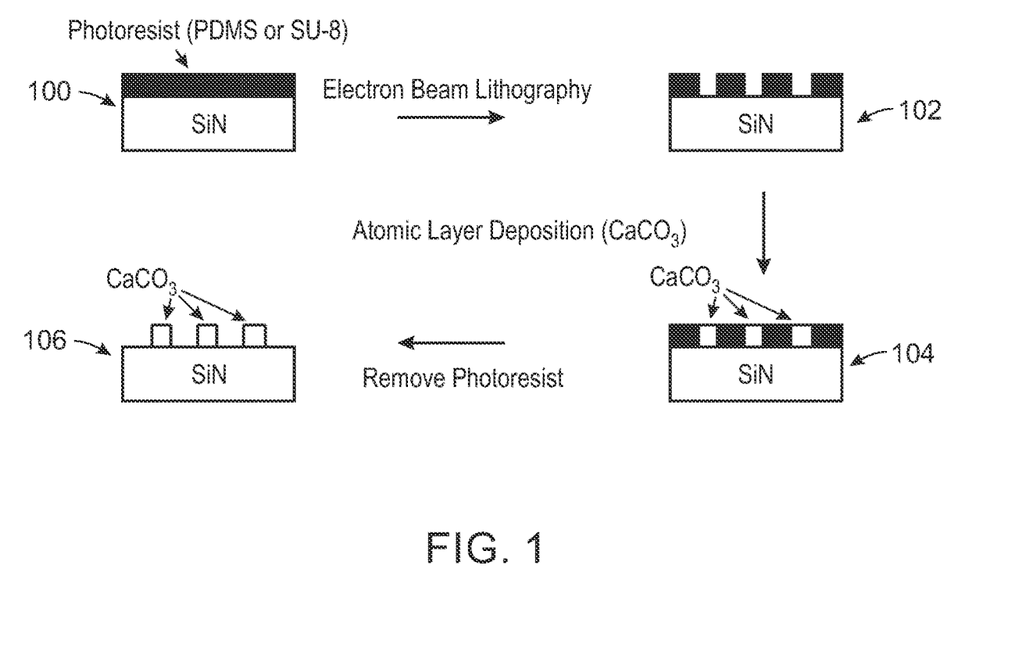
FIG. 1 is a schematic diagram illustrating examples of components of a procedure for fabrication of a nanofluidic calcite cell, according to some implementations of the present disclosure.

FIG. 1 is a schematic diagram illustrating examples of components of a procedure for the fabrication of a nanofluidic calcite cell, according to some implementations of the present disclosure. At 100, a photoresist is deposited on a silicon nitride (SiN) substrate. At 102, channels are etched. At 104, the channels are filled with carbonate rock, such as calcite. At 106, the photoresist is removed, leaving only the carbonate rock.

In some implementations, the channels of FIG. 1 are fabricated with one or more of the following conditions. The photoresist is polydimethylsiloxane (PDMS) or the epoxy-based negative photoresist known as SU-8. The photoresist is spin coated on the substrate. The spin coating condition is between 3000 and 5000 rpm. The slow initial spin is 500 rpm for 5 to 10 seconds. The channels are etched using EL, where a portion of the photoresist is exposed to a beam of electrons. The channels are in the shape of cylindrical columns. The columns have a diameter of around 50 to 100 nanometers. The channels are filled using ALD using a carbonate precursor gas. The ALD aimed calcite deposition thickness is 100 nm. The parameters of the ALD are shown in Table 1.

EXAMPLE 1

| | | | Deposition cycles | | | | | | |
|---|---|---|---|---|---|---|---|---|---|
| Temperature (° C.) | Aimed thickness (nm) | Sublimation temperature (° C.) | Ca(thd)$_2$ pulse (s) | N$_2$ purge (s) | O$_2$ pulse (s) | N$_2$ purge (s) | CO$_2$ pulse (s) | N$_2$ purge (s) | Number of cycles |
| 300 | 100 | 195 | 3 | 2 | 3 | 2 | 3 | 2 | 2000 |

ALD Parameters

The remaining photoresist is removed using a solvent. The solvent is propylene glycol methyl ether acetate, ethyl lactate, or di-acetone alcohol.

Figure 2:
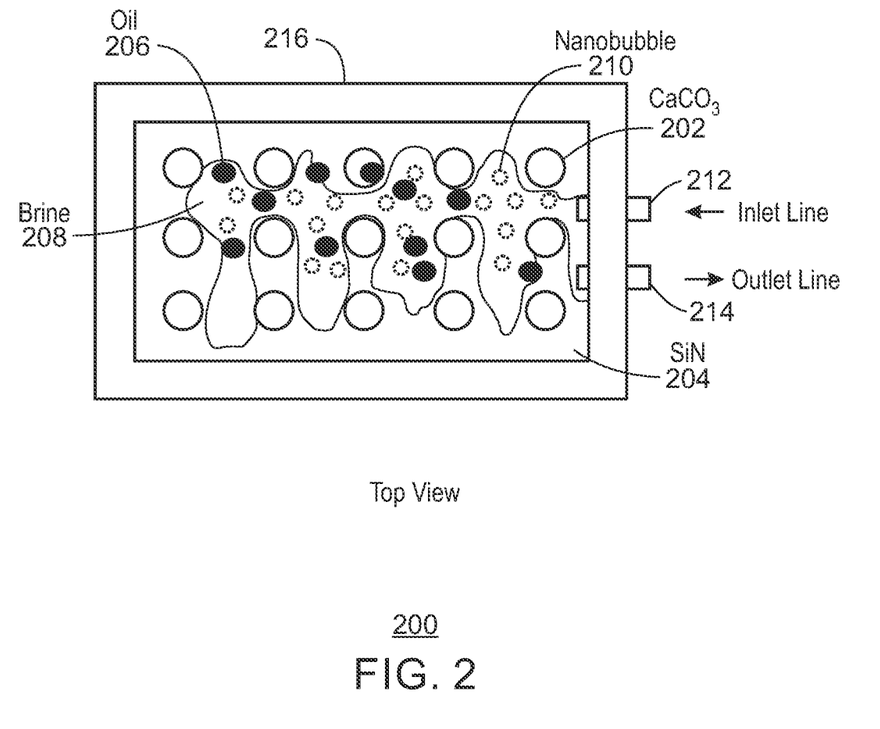
FIG. 2 is a schematic diagram of an example of the top of a nanofluidic calcite cell, according to some implementations of the present disclosure.

FIG. 2 is a schematic diagram of an example of the top of a nanofluidic calcite cell, according to some implementations of the present disclosure. The cell 200 contains calcite structures 202 on top of a SiN substrate 204. The calcite structures 202 are in the shape of cylindrical columns. The cell 200 contains a sample of oil 206, brine 208, and nanobubbles 210. The sample is injected from an inlet line 212, flows through the cell 200, and exits through an outlet line 214. The substrate sits in a TEM holder 216.

In some implementations, the inlet and outlet lines contain one or more of the following features. There is an inlet line for the nanobubbles and a separate inlet line for the oil and brine. The inlet lines are conduits, such as pipes. In some implementations, the substrate has a diameter of less than 3 millimeters.

Figure 3:
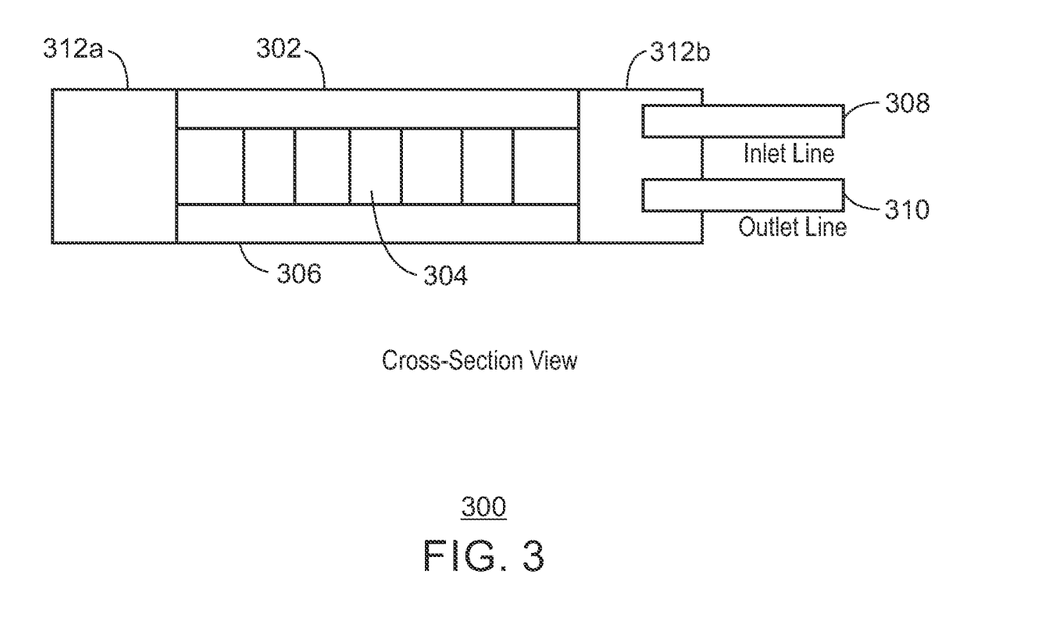
FIG. 3 is a schematic diagram of an example of a cross section of a nanofluidic calcite cell, according to some implementations of the present disclosure.

FIG. 3 is a schematic diagram of an example of a cross section of a nanofluidic calcite cell, according to some implementations of the present disclosure. The cell 300 is covered by a SiN transparent window 302. The cell 300 contains calcite structures 304 on the top of a SiN substrate 306. The cell 300 also contains an inlet line 308 and an outlet line 310. The substrate sits in a TEM holder 312.

Figure 4:
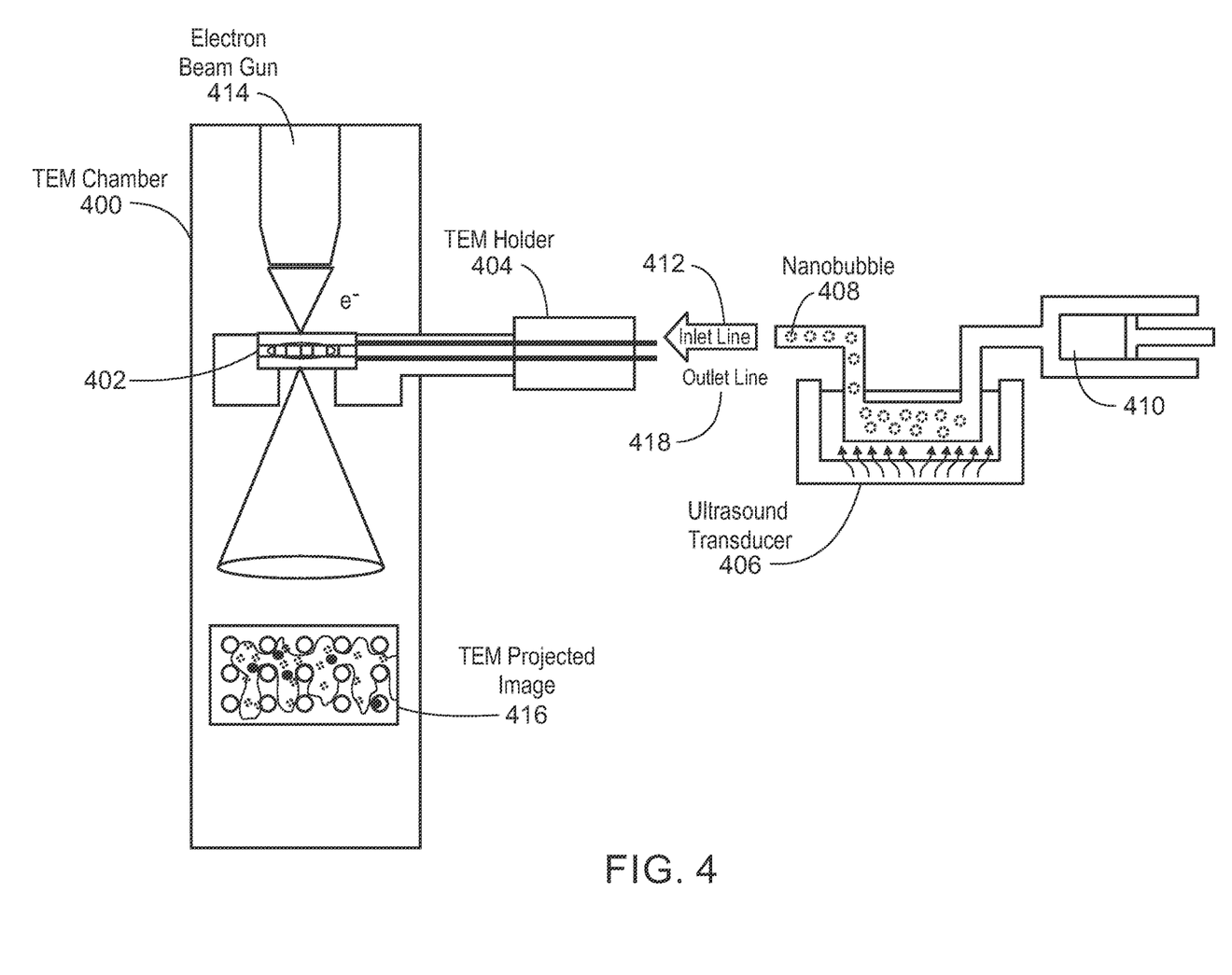
FIG. 4 is a schematic diagram illustrating an example system of a nanofluidic calcite cell within a TEM chamber, according to some implementations of the present disclosure.

FIG. 4 is a schematic diagram illustrating an example system of a nanofluidic calcite cell within a TEM chamber, according to some implementations of the present disclosure. The system includes a TEM chamber 400. The cell 402 is placed within the TEM chamber 400 and held by a TEM holder 404. The system further includes an ultrasound transducer 406, which generates nanobubbles 408 to add to a sample 410 of oil and brine. The sample 410 flows through an inlet line 412 to the cell 402. The sample 410 flows through the cell 402 and the TEM electron beam gun 414 projects an image 416 of the sample 410. The sample 410 then flows out an outlet line 418.

In some implementations, the ultrasound tranducer is operated at the following conditions. The ultrasound transducer is operated at a capacitance of 42 kHz and a power of 70 watts. The total amount of gas (nitrogen, methane, or argon) is about 600 cm 3 (standard state) per 1 dm' of water under atmospheric conditions at 298K. The generated nanobubbles have a diameter of around 300 to 500 nanometers.

Figure 5:
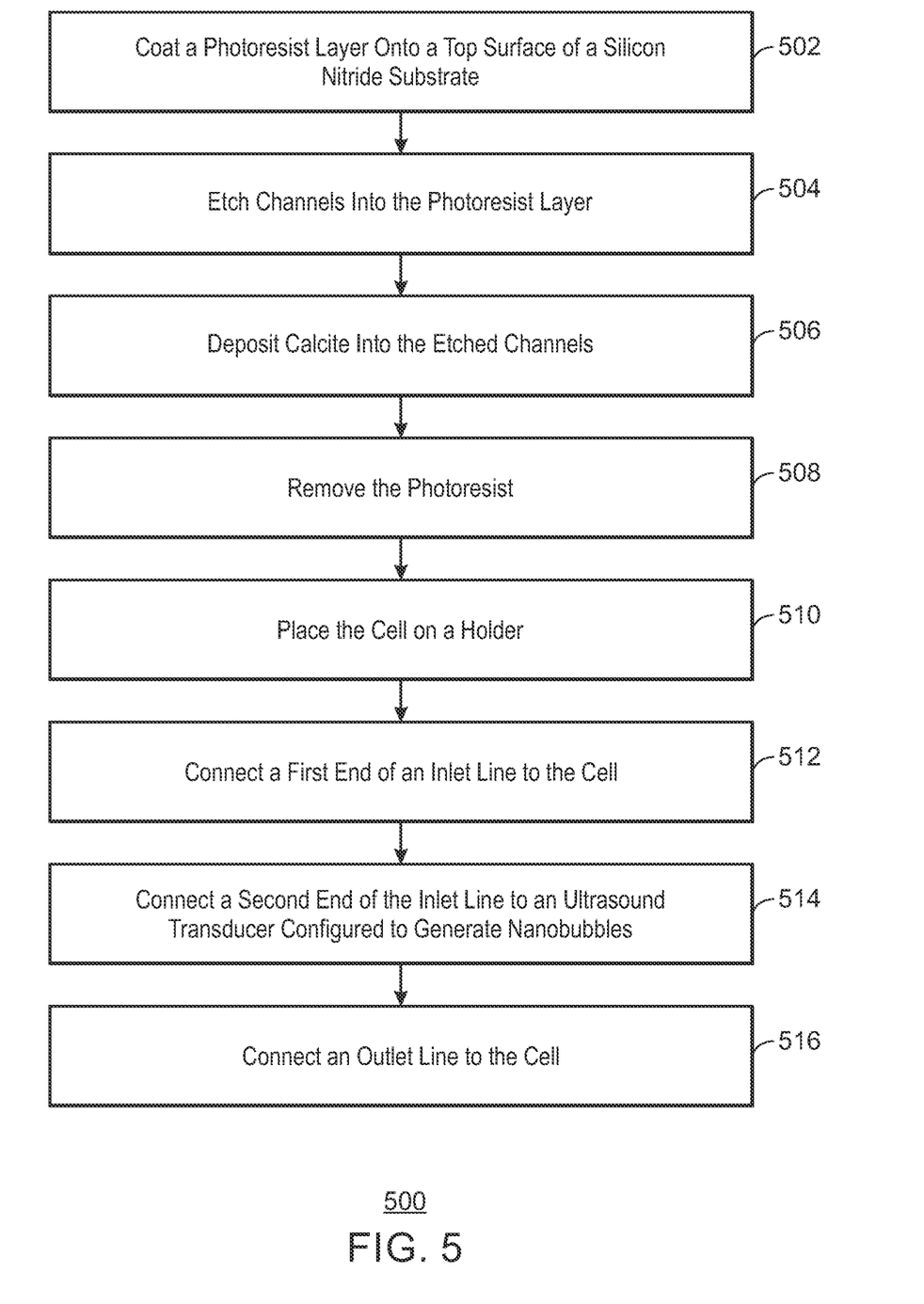
FIG. 5 is a flow chart of an example method for the fabrication of a nanofluidic calcite cell, according to some implementations of the present disclosure.

FIG. 5 is a flow chart of an example method for the fabrication of a nanofluidic calcite cell, according to some implementations of the present disclosure. At block 502, a photoresist layer is coated onto a top surface of a silicon nitride substrate. At block 504, channels are etched into the photoresist layer. At block 506, calcite is deposited into the etched channels. At block 508, the photoresist is removed. At block 510, the cell is placed on a holder. At block 512, a first end of an inlet line is connected to the cell. At block 514, a second end of the inlet line is connected to an ultrasound transducer configured to generate nanobubbles. At block 516, an outlet line is connected to the cell.

Described implementations of the subject matter can include one or more features, alone or in combination. For example, an implementation is a method that includes the following steps. Coating a photoresist layer onto a top surface of a silicon nitride substrate; etching channels into the photoresist layer; depositing calcite into the etched channels; removing the photoresist; placing the cell on a holder; connecting a first end of an inlet line to the cell; connecting a second end of the inlet line to an ultrasound transducer configured to generate nanobubbles; and connecting an outlet line to the cell.

The foregoing and other described implementations can each, optionally, include one or more of the following features:

Flowing a sample including oil and nanobubbles from the inlet line, through the cell, and out the outlet line.

The photoresist is spin coated on the substrate.

Depositing the calcite with atomic layer deposition.

Depositing the calcite using a calcite precursor gas.

The photoresist is polydimethylsiloxane or SU-8.

Removing the photoresist with a solvent.

The solvent includes propylene glycol methyl ether acetate, ethyl lactate, or di-acetone alcohol.

The substrate has a diameter of less than 3 millimeters.

Operating the ultrasound transducer at a capacitance of 42 kHz and a power of 70 watts.

The nanobubbles have a diameter of around 300 to 500 nanometers.

Etching the channels with electron beam lithography.

The sample includes brine.

The channels are in the shape of cylindrical columns.

The etched channels have a diameter of around 50 to 100 nanometers.

Covering the top of the cell with a transparent silicon nitride window.

A second implementation is a nanofluidic LCTEM cell. The cell includes a silicon nitride substrate; calcite channels on the top of the substrate; a first end of an inlet line connected to the cell; a second end of the inlet line connected to an ultrasound transducer configured to generate nanobubbles; and an outlet line connected to the cell. The foregoing and other described implementations can each, optionally, include one or more of the following features:

The substrate has a diameter of less than 3 millimeters.

The ultrasound transducer has a capacitance of 42 kHz and a power of 70 watts.

The nanobubbles have a diameter of around 300 to 500 nanometers.

The channels are in the shape of cylindrical columns.

The channels have a diameter of around 50 to 100 nanometers.

A transparent silicon nitride window on top of the cell.

Thus, particular implementations of the subject matter have been described. Other implementations are within the scope of the following claims.

What is claimed is:

1. A method of preparing a nanofluidic LCTEM cell, comprising:
    coating a photoresist layer onto a top surface of a silicon nitride substrate;
    etching channels into the photoresist layer;
    depositing calcite into the etched channels;
    removing the photoresist;
    placing the cell on a holder;
    connecting a first end of an inlet line to the cell;
    connecting a second end of the inlet line to an ultrasound transducer configured to generate nanobubbles; and
    connecting an outlet line to the cell.

2. The method of claim 1, further comprising flowing a sample comprising oil and nanobubbles from the inlet line, through the cell, and out the outlet line.

3. The method of claim 2, wherein the sample further comprises brine.

4. The method of claim 1, wherein the photoresist is spin coated on the substrate.

5. The method of claim 4, further comprising depositing the calcite using a calcite precursor gas.

6. The method of claim 1, further comprising depositing the calcite with atomic layer deposition.

7. The method of claim 1, wherein the photoresist is polydimethylsiloxane or SU-8.

8. The method of claim 1, further comprising removing the photoresist with a solvent.

9. The method of claim 8, wherein the solvent comprises propylene glycol methyl ether acetate, ethyl lactate, or di-acetone alcohol.

10. The method of claim 1, wherein the substrate has a diameter of less than 3 millimeters.

11. The method of claim 1, further comprising operating the ultrasound transducer at a capacitance of 42 kHz and a power of 70 watts.

12. The method of claim 1, wherein the nanobubbles have a diameter of around 300 to 500 nanometers.

13. The method of claim 1, further comprising etching the channels with electron beam lithography.

14. The method of claim 1, wherein the channels are in the shape of cylindrical columns.

15. The method of claim 14, wherein the etched channels have a diameter of around 50 to 100 nanometers.

16. The method of claim 1, further comprising:
    covering the top of the cell with a transparent silicon nitride window.

17. A nanofluidic LCTEM cell, comprising:
    a silicon nitride substrate;
    calcite channels on the top of the substrate;
    a first end of an inlet line connected to the cell;
    a second end of the inlet line connected to an ultrasound transducer configured to generate nanobubbles; and
    an outlet line connected to the cell.

18. The nanofluidic LCTEM cell of claim 17, wherein the substrate has a diameter of less than 3 millimeters.

19. The nanofluidic LCTEM cell of claim 17, wherein the ultrasound transducer has a capacitance of 42 kHz and a power of 70 watts.

20. The nanofluidic LCTEM cell of claim 17, wherein the nanobubbles have a diameter of around 300 to 500 nanometers.

21. The nanofluidic LCTEM cell of claim 17, wherein the channels are in the shape of cylindrical columns.

22. The nanofluidic LCTEM cell of claim 21, wherein the channels have a diameter of around 50 to 100 nanometers.

23. The nanofluidic LCTEM cell of claim 17, further comprising:
    a transparent silicon nitride window on top of the cell.

* * * * *